Figure 1:
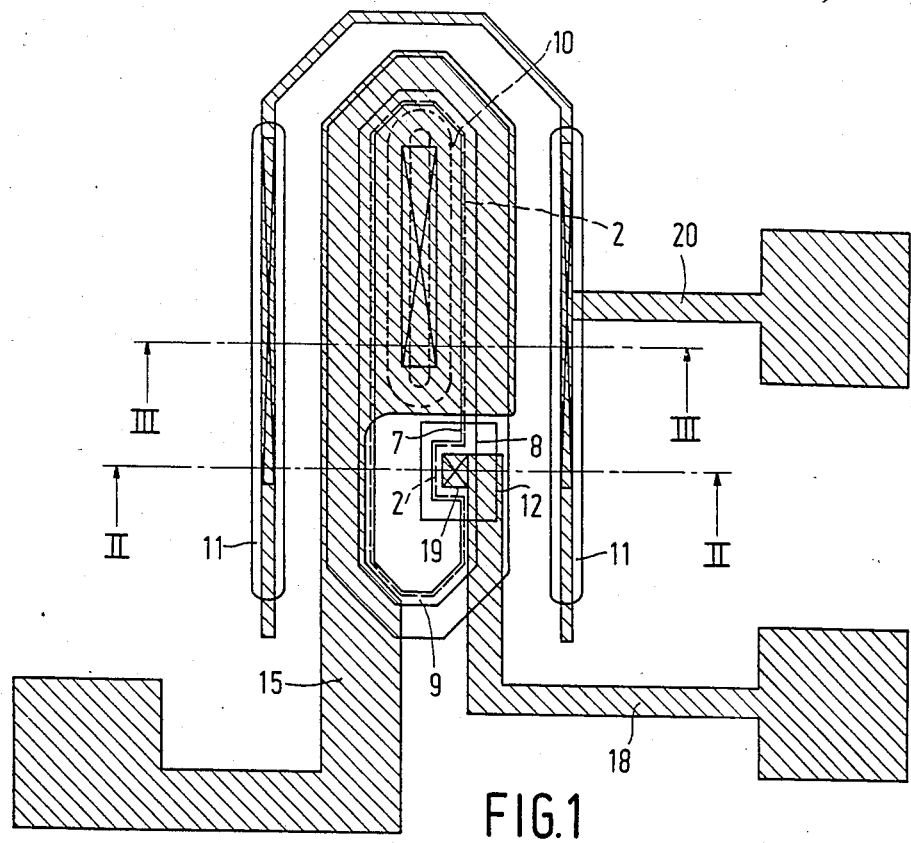

United States Patent [19]

Ludikhuize

[11] Patent Number: 4,682,205
[45] Date of Patent: Jul. 21, 1987

[54] SEMICONDUCTOR DEVICE
[75] Inventor: Adrianus W. Ludikhuize, Eindhoven, Netherlands
[73] Assignee: U.S. Philips Corporation, New York, N.Y.
[21] Appl. No.: 837,867
[22] Filed: Mar. 5, 1986

Related U.S. Application Data
[63] Continuation of Ser. No. 541,643, Oct. 13, 1983.

[30] Foreign Application Priority Data
Oct. 25, 1982 [NL] Netherlands ............................ 8204105
[51] Int. Cl.⁴ .................... H01L 29/40; H01L 29/44; H01L 29/78
[52] U.S. Cl. ........................................ 357/53; 357/65; 357/68; 357/23.4
[58] Field of Search ...................... 357/53, 65, 68, 23.4
[56] References Cited
U.S. PATENT DOCUMENTS

| 3,094,633 | 6/1963 | Harries ................................ 307/88.5 |
| 3,405,329 | 10/1968 | Loro et al. ............................ 357/53 |
| 3,538,398 | 11/1970 | Whiting ............................... 357/52 |
| 3,544,861 | 12/1970 | Kooi .................................... 357/53 |
| 3,845,495 | 10/1974 | Cauge et al. ................... 357/23 VD |
| 3,909,320 | 9/1975 | Cauge et al. ................... 357/23 VD |
| 3,926,694 | 12/1975 | Cauge et al. ................... 357/23 VD |
| 4,064,523 | 12/1977 | London ................................ 357/53 |
| 4,408,384 | 10/1983 | Louis et al. ........................... 357/20 |
| 4,561,003 | 12/1985 | Tihanyi et al. ..................... 357/23.4 |

FOREIGN PATENT DOCUMENTS
0037105  3/1981  European Pat. Off. ........... 357/23.4

OTHER PUBLICATIONS
Conti et al., "Surface Breakdown . . . Field Plate", *Solid-State Elect.* 1972, vol. 15, pp. 93–105 Pergamon Press.

Primary Examiner—Andrew J. James
Assistant Examiner—Jerome Jackson
Attorney, Agent, or Firm—Robert T. Mayer

[57] ABSTRACT

A semiconductor device having a planar pn junction (2) between a more highly doped first region (4) and a more weakly doped second region (5) of the opposite conductivity type, a narrow strip-shaped conductive layer (9) used as a field plate being present above this junction (2), which layer has substantially the same potential as the first region (4) and an edge (7) which substantially coincides with the pn junction (2). The conductive layer (9) locally comprises a widened part (14) suitable for contacting purposes, which, in order to avoid breakdown, is constituted by a protuberance of the said edge (7) towards the first region (4). The invention is of particular importance in DMOS transistor structures, in which the said field plate is connected to the gate electrode.

7 Claims, 8 Drawing Figures

SEMICONDUCTOR DEVICE

This is a continuation of application Ser. No. 541,643, filed Oct. 13, 1983.

The invention relates to a semiconductor device comprising a semiconductor body having a planar pn-junction between a first region of a first conductivity type adjoining a surface and a second region of the second opposite conductivity type also adjoining the surface, which latter region has a lower doping than the first region, an electrically insulating layer on the surface, and on this layer a narrow strip-shaped electrically conductive layer which is located above the pn junction, is bounded by a first and a second edge and extends above the second region, said first edge substantially coinciding with the line of intersection of the pn junction and the surface, the potential of said conductive layer being substantially equal to that of the first region.

Semiconductor devices having a structure of the kind described above are frequently used in planar monolithic integrated circuits. They are obtained, for example, when the said conductive layer, which may be, for example, a field plate or gate electrode, but also a strip-shaped conductor used for other purposes, is used as a mask at the time when the planar pn junction is formed. A known example is an insulated gate field effect transistor of the so-called DMOS type having a gate electrode which extends as a field plate above a weakly doped drift region of a conductivity type opposite to that of the channel region. Such field effect transistor structures are described, for example, in U.S. Pat. No. 3,926,694. They are manufactured in a self-aligning manner by diffusing the source zone and the channel region at least in part through the same window. In this case, a part of the gate electrode can be used as a mask if it is capable of withstanding the diffusion temperature and consists, for example, of polycrystalline silicon.

In such semiconductor structures manufactured in a self-aligning manner, in which the conductive layer is used as a mask, the line of intersection of the planar pn junction and the surface substantially coincides with an edge of the conductive layer. The distance between this edge and the line of intersection of the pn junction is in fact determined by the (slight) lateral diffusion which occurs below the conductive layer. When, as in many cases, it is desirable that the planar pn junction has a comparatively high breakdown voltage, the conductive layer must not extend over an excessively large distance above the weakly doped second region, that is to say that it must not have an excessively large width, in order to prevent the risk of breakdown. For, if the conductive layer has an excessively large width, such a high voltage will occur at its second edge located above the weakly doped second region between the conductive layer and the second region that at this area the field strength at the semiconductor surface becomes so large that breakdown may occur through the insulating layer or in the semiconductor material located below the insulating layer.

In structures in which comparatively large voltage differences occur over small lateral distances, the maximum width of the conductive layer that is allowed according to the above indications is frequently too small to provide a good contact on the conductive layer. A local widening of the layer provided to this end for the same reasons will normally also involve the said risk of breakdown.

The invention has inter alia for its object to provide a local widening of the conductive layer suitable for contacting purposes without the risk of breakdown being involved.

The invention is based inter alia on the recognition of the fact that this can be achieved in that the geometry of the pn junction and that of the conductive layer are adapted to one another in an efficacious manner.

According to the invention, a semiconductor device of the kind described in the preamble is characterized in that the conductive layer is locally provided with a widened part for contacting purposes, the first edge of the conductive layer substantially coinciding with the said line of intersection also at the area of the widened part and the widened part being constituted by a protuberance of at least said first edge towards the first region.

Due to the fact that, according to the invention, the pn junction at the area of the widened part has a shape such that, in the case of operation in the reverse direction, the depletion zone extends at this area into the more weakly doped second region in converging directions, the reverse voltage at the area of the widened part is absorbed by a comparatively wide part of the depletion zone. As a result, the surface field strength at the area of the widened part is also proportionally reduced so that the aforementioned risk of breakdown can be avoided.

In most cases the edges of the conductive layer outside the widened part will be practically parallel to each other. Further, generally at the area of the widened part only the said first edge will exhibit a change of direction, whereas the second edge extends without change of direction. Should the case arise, however, the second edge may alternatively exhibit at the area of the widened part a "re-entrant part", i.e. a change in the same direction as the first edge (but smaller than that of the first edge).

The conductive layer may be a metal layer, but also a doped semiconductor layer, for example a silicon layer.

Although the invention can be used in greatly different semiconductor structures, it is of particular importance in DMOST structures. In this case, the said first region constitutes the channel region and the second region constitutes the drift region of a DMOS transistor, while the conductive layer is a field plate of substantially the same potential as the channel region and the source zone shortcircuited therewith. This field plate may be connected to or be integral with the gate electrode of the DMOST.

In order to obtain the envisaged widening of the depletion zone, it is desirable that the dimension of the widened part, measured in the longitudinal direction of the strip-shaped conductive layer, is so small that the parts of the depletion zone extending in the second region from the ends of the widened part towards each other merge at a reverse voltage across the pn junction at which breakdown does not yet occur.

Figure 2:
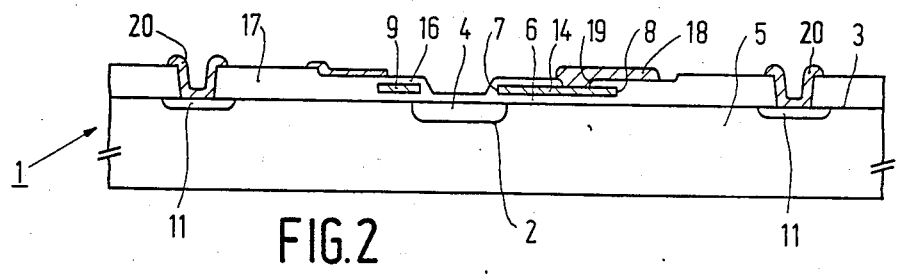
Figure 3:
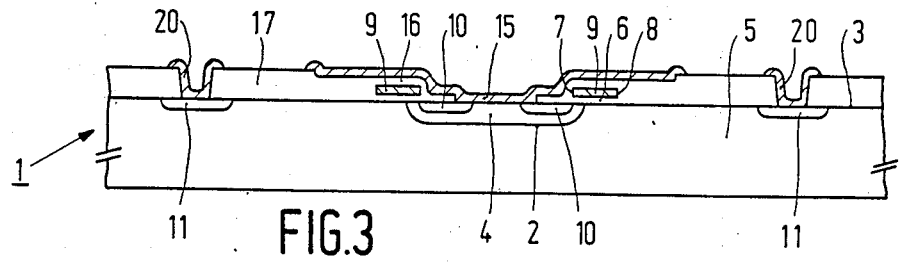
Figure 4:
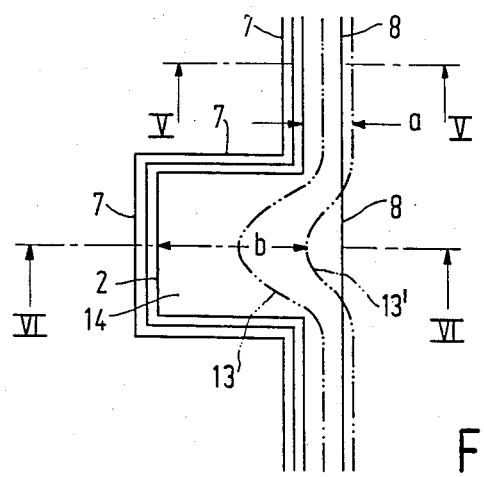
Figure 5:
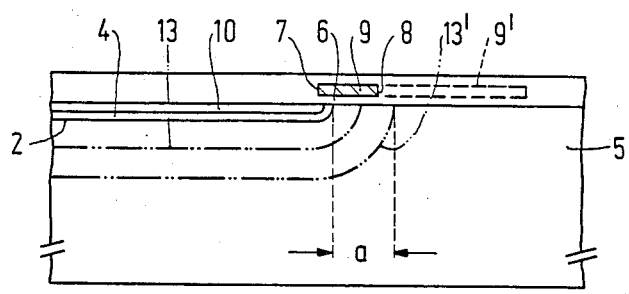
Figure 6:
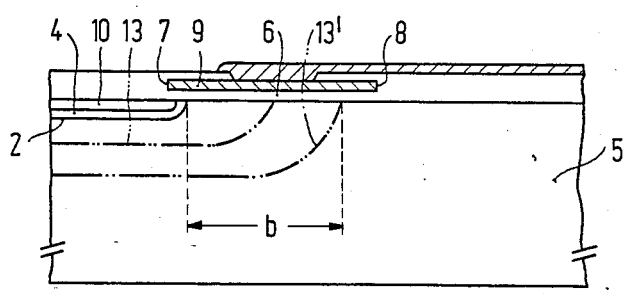
Figures 7, 8:
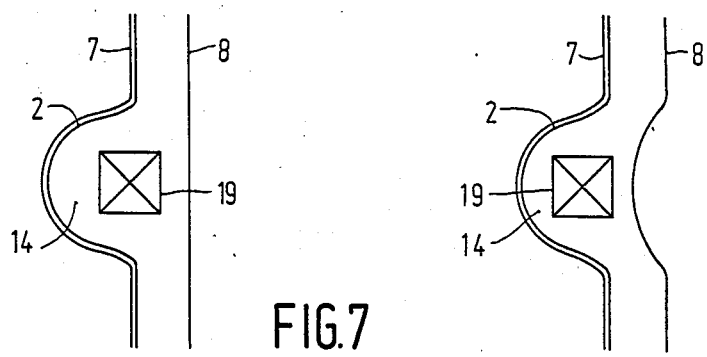

The invention will now be described more fully with reference to an embodiment and the drawing, in which:

FIG. 1 shows diagrammatically in plan view a semiconductor device according to the invention, FIGS. 2 and 3 show diagrammatically cross-sections of the device shown in FIG. 1 taken on the lines II—II and III—III, respectively, of FIG. 1, FIG. 4 shows in plan view and FIGS. 5 and 6 show in cross-sections taken on the lines V—V and VI—VI, respectively, a detail, which is enclosed in FIG. 1 by the line 12, and FIGS. 7 and 8 show modifications of the geometry of FIG. 4.

The Figures are purely schematic and not drawn to scale. This applies especially to the direction of thickness.

In plan view contact windows are provided with diagonals, while metal layers are shaded.

FIG. 1 shows in plan view and FIGS. 2 and 3 show diagrammatically in cross-sections taken on the lines II—II and III—III, respectively, of FIG. 1 a semiconductor device according to the invention, in this example an insulated gate field effect transistor of the so-called DMOS type. The device comprises a semiconductor body 1, in this example of silicon, although other semiconductor materials may be used. In this semiconductor body is located a planar pn junction 2 between a first region 4 of a first conductivity type, in this example the p-conductivity type, adjoining a surface 3 and a second region 5 of the second opposite conductivity type, in this case the n-conductivity type, also adjoining the surface 3, which second region 5 has a lower doping than the first region 4. The region 4 constitutes the channel region and the region 5 constitutes the drift region of the DMOS transistor.

On the surface 3 further there is provided an electrically insulating layer 6, in this example of silicon oxide, and on this layer is disposed above the pn junction 2 a narrow strip-shaped electrically conductive layer 9 bounded by a first edge 7 and a second edge 8. The layer 9 constitutes the gate electrode of the DMOS transistor and also operates as a field plate. In this example, the layer 9 consists of polycrystalline silicon. However, it may alternatively consist of a metal or any other metallic conductive material. The first edge 7 of the layer 9 substantially coincides with the line of intersection of the pn junction 2 and the surface 3. The potential of the conductive layer 9 in the operating condition is substantially equal to that of the first region 4 and differs from the latter only by the gate voltage, which is small with respect to the reverse voltage to be applied in the operating condition of the pn junction 2. The n-type conductive source zone 10 is provided inside the channel region 4 and is shortcircuited with this region by the metal layer 15. The highly doped n-type conductive zones 11 constitute the drain zone. A further oxide layer 16 is formed on the polycrystalline silicon layer 9. A thicker oxide layer 17 is present around the outside of the DMOST. The metal layer 18 contacts through a contact window 19 in the oxide layer 16 the conductive silicon layer 9. The drain zone 11 is contacted by a metal layer 20.

The conductive layer 9 is comparatively narrow, in this example approximately 6 $\mu$m. This is necessary because otherwise breakdown could occur. For illustration, reference is made to FIGS. 4 to 6. Of these Figures, FIG. 4 is a plan view and FIGS. 5 and 6 are diagrammatic cross-sections of the detail enclosed in FIG. 1 by the line 12. The boundary of the depletion zone, which extends from the pn junction 2 into the region 5 of low doping, is indicated in FIGS. 4, 5 and 6 by the lines 13 and 13'. The boundary line 13' is associated with a higher reverse voltage across the pn junction 2 than the line 13.

If the conductive layer 9 (see FIG. 5) extended too far beyond the pn junction 2, for example as indicated by the broken lines 9', such a large voltage difference between the region 5 and the layer 9 would occur at the edge 8 of the layer 9 remotest from the pn junction 2 that breakdown could occur near this edge. The width of the layer 9 consequently must not exceed at the area of the cross-section V—V a given value, dependent upon the dopings, the thickness of the layer 6 and other factors. In this example, this limit value amounts to approximately 6 /$\mu$m, which is too small to provide a good contact on the layer 9 through a contact window.

Consequently, the conductive layer 9 cannot be given a local widening towards the drain, zone 11 suitable for contacting purposes. On the other hand, a widened part towards the source zone 10 such that the layer 9 would locally extend further across the source zone 10 is also undesirable because in the manufacture of the DMOST the source zone 10 and the channel region 4 are preferably formed by doping whilst using the layer 9 as a mask. The technology generally used for the manufacture of a DMOST would have to be modified for this purpose and would become more complicated.

According to the invention, this problem is solved in that the conductive layer 9 is locally provided with a widened part 14 suitable for contacting purposes (see FIG. 4), while also at the area of the widened part the first edge 7 of the conducting layer 9 substantially coincides with the line of intersection of the pn junction 2 and the surface, this widened part being constituted by a protuberance of the first edge 7 towards the first region 4.

When the widened part is provided in the manner described above, the shape of the pn junction 2 at the area of the widened part is such that the depletion zone extends from three sides into the region 5. As a result, the width (b) (associated with the boundary line 13') of the depleted region at the area of the widened part 14 is considerably larger than the width (a) outside the widened part; see FIGS. 4–6. Consequently, the conductive layer 9 can have at the widened part 14 a width of, for example, 16/$\mu$m sufficient for contacting, without the risk of breakdown occurring at the edge 8. Since further, as already stated, the pn junction 2 everywhere, hence also at the widened part, substantially coincides with the edge 7 of the conductive layer, the layer 9 may everywhere, also at the widened part 14, be used as masking layer for forming the regions 4 and 10 according to the method used in the normal manufacture of DMOS transistors.

Consequently in structures comprising a planar pn junction and a conductive layer, for example, a field plate, which is used as a mask when forming the pn junction and which, in order to avoid breakdown, is too narrow for contacting purposes, the invention nevertheless provides a simple method which permits a widened portion to be provided for contacting said conductive layer.

In order to obtain an effective widening of the depletion zone, the widened part 14 must not extend over an excessively large part of the conducting layer 9. An efficient widening of the depletion zone is obtained in particular when at higher reverse voltages across the pn junction 2, but before breakdown occurs, the parts of the depletion zone, which extend from the two ends of the widened part 14 towards each other merge.

The widened part need not be rectangular, but may also be bounded by a curved edge 7, as indicated in FIG. 7. Further, if the case should arise, the widening can be obtained in a manner such that also the second edge 8 of the layer 9 exhibits a change of direction towards the first region 4, as indicated in FIG. 8.

In the example described here, the semiconductor device was a DMOS transitor. However, the invention may be used in all cases in which planar junctions with conductive layers acting as a field plate and as a mask are present. Furthermore, the conductivity types mentioned in the example may be replaced by the opposite conductivity types so that the region 4 is n-type conductive and the region 5 is p-type conductive and has a lower doping than the region 4. Instead of silicon, the semiconductor material used may be, for example, gallium arsenide, germanium or another semiconductor material. Moreover, instead of silicon oxide, the insulating layers 6, 16 and 17 may comprise silicon nitride or another insulating material. Instead of a silicon layer, the layer 9 may be a metal layer, for example, a molybdenum or tungsten layer or another metallic conductive material such as platinum silicide, and in the described example may be connected to the source electrode instead of to the gate electrode.

What is claimed is:

1. A semiconductor device comprising a semiconductor body having a planar pn-junction between a first region of a first conductivity type adjoining a surface and a second region of the second opposite conductivity type also adjoining the surface, which latter region has a lower doping than the first region, means for reverse biasing said planar junction in operation, an electrically insulating layer on the surface, and on this layer a narrow strip-shaped electrically conductive layer which is located above the pn junction, is bounded by a first and a second edge and extends above the second region, said first edge substantially coinciding with the line of intersection of the pn junction and the surface, the potential of said conductive layer being substantially equal to that of the first region, characterized in that the conductive layer is locally provided with a widened part for contacting purposes, said widened part being constituted by a protuberance of at least said first edge towards the first region thereby increasing said second region's depletion zone at said protuberance, said first region being altered relative to said first edge of said conducting layer at said widened part whereby said first edge substantially coincides with said line of intersection also at the area of said widened part and partly encloses an area of said second region.

2. A semiconductor device as claimed in claim 1, characterized in that the first and the second edge of the conductive layer outside said widened part extend practically parallel to each other.

3. A semiconductor device as claimed in claim 2, characterized in that at the area of the widened part only the first edge exhibits a change of direction.

4. A semiconductor device as claimed in claim 3, characterized in that the dimension of the widened part, measured in the longitudinal direction of the strip-shaped conductive layer, is so small that the parts of the depletion zone extending in the second region from the ends of the widened part towards each other merge at a reverse voltage across the pn junction at which breakdown does not yet occur.

5. A semiconductor device as claimed in claim 4, characterized in that the first region constitutes the channel region and the second region constitutes the drift region of a DMOS transistor, while the conductive layer constitutes a field plate which has substantially the same potential as the channel region and the source zone shortcircuited therewith.

6. A semiconductor device as claimed in claim 5, characterized in that the field plate is connected to the gate electrode of the DMOS transistor.

7. A semiconductor device as claimed in anyone of the preceding claims, characterized in that the conductive layer is a silicon layer.

* * * * *